(12) United States Patent
Watanabe et al.

(10) Patent No.: US 7,555,038 B2
(45) Date of Patent: Jun. 30, 2009

(54) TRANSMISSION SYSTEM, SIGNAL RECEIVER, TEST APPARATUS AND TEST HEAD

(75) Inventors: Daisuke Watanabe, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 496 days.

(21) Appl. No.: 11/296,806

(22) Filed: Dec. 7, 2005

(65) Prior Publication Data
US 2006/0109895 A1 May 25, 2006

Related U.S. Application Data (63) Continuation of application No. PCT/JP2004/007976, filed on Jun. 8, 2004.

(30) Foreign Application Priority Data
Jun. 9, 2003 (JP) ............................. 2003-163694

(51) Int. Cl.
*H04B 3/46* (2006.01)
(52) U.S. Cl. ..................... 375/224; 375/259; 375/371; 327/149
(58) Field of Classification Search ......... 375/224–226, 375/219, 259, 371, 373–376, 369; 327/146, 327/149, 152, 153, 156, 158, 234–236; 702/66, 702/69, 108
See application file for complete search history.

(56) References Cited

U.S. PATENT DOCUMENTS

| | | | | |
|---|---|---|---|---|
| 5,297,869 A | * | 3/1994 | Benham | .................... 375/361 |
| 5,548,249 A | * | 8/1996 | Sumita et al. | ................ 331/1 A |
| 5,920,600 A | | 7/1999 | Yamaoka et al. | |
| 6,067,651 A | * | 5/2000 | Rohrbaugh et al. | ......... 714/738 |
| 6,483,871 B1 | * | 11/2002 | Dawe | ......................... 375/226 |
| 2003/0177272 A1 | * | 9/2003 | Shimosakoda | .............. 709/248 |

FOREIGN PATENT DOCUMENTS

| | | |
|---|---|---|
| JP | 11-88312 | 3/1999 |
| JP | 2000-13218 | 1/2000 |
| JP | 2002-198940 | 7/2002 |

OTHER PUBLICATIONS

International Search Report issued for PCT application No. PCT/JP2004/007976 mailed on Sep. 14, 2004, 1 page.
Patent Abstracts of Japan, Publication No. 2000-013218, Publication Date: Jan. 14, 2000, 2 pages.

* cited by examiner

*Primary Examiner*—David C Payne
*Assistant Examiner*—Rahel Guarino
(74) *Attorney, Agent, or Firm*—Osha • Liang LLP (57) ABSTRACT

A transmission system for transmitting a transmission signal, includes a section for outputting a periodic clock having a preset period, a section for transmitting the transmission signal in synchronism with the periodic clock, and a section for receiving the transmission signal transmitted from the transmitting section. The receiving section includes a section for generating a data synchronizing clock synchronized with variation of values of sampling data, section for detecting a phase difference between the periodic clock and the data synchronizing clock, and a section for generating a phase variable clock obtained by varying phase of the periodic clock so that a variable phase difference which is a phase difference between the phase variable clock and the data synchronizing clock becomes an amount set in advance.

9 Claims, 6 Drawing Sheets

TRANSMISSION SYSTEM, SIGNAL RECEIVER, TEST APPARATUS AND TEST HEAD

CROSS REFERENCE TO RELATED APPLICATION

This is a continuation application of PCT/JP 2004/007976 filed on Jun. 8, 2004 which claims priority from a Japanese Patent Application No. 2003-163694 filed on Jun. 9, 2003, the contents of which are incorporated herein by reference.

BACKGROUND OF THE INVENTION

1. Technological Field

The present invention relates to a transmission system, a signal receiver, a test apparatus and a test head. More specifically, the invention relates to a transmission system, a signal receiver, a test apparatus and a test head for transmitting a transmission signal.

2. Background Art

Conventionally, there has been known a signal transmission method for transmitting a signal in synchronism with a clock outputted from a PLL (Phase Locked Loop) as disclosed, for example, in Japanese Patent Application Publication (Laid-Open) No. 2000-13218 (in particular FIG. 1) and Japanese Patent Application Publication (Laid-Open) No. 2002-198940 (in particular FIG. 1). The PLL has a VCO (Voltage Controlled Oscillator) and oscillates the VCO with predetermined frequency by applying voltage based on a phase difference between an output of the reference oscillator and an output of the VCO to output an output of the VCO to the outside as an output clock.

However, the output clock of the PLL contains random jitter caused by phase noise of the VCO. Therefore, there has been a case when an error occurs in transmitting a signal by using the clock outputted from the PLL due to the random jitter for example.

Accordingly, it is an object of the invention to provide a transmission system, a signal receiver, a test apparatus and a test head capable of solving the above-mentioned problem. This object may be achieved through the combination of features described in independent claims of the invention. Dependent claims thereof specify preferable embodiments of the invention.

SUMMARY OF THE INVENTION

According to a first aspect of the invention, there is provided a transmission system for transmitting a transmission signal, having a periodic clock output section for outputting a periodic clock having a preset period, a transmitting section for transmitting the transmission signal in synchronism with the periodic clock and a receiving section for receiving the transmission signal transmitted from the transmitting section, wherein the receiving section has a data synchronizing clock generating section for generating, based on sampling data sampled from the transmission signal received from the transmitting section, a data synchronizing clock synchronized with variation of values of the sampling data, a periodic phase difference detecting section for detecting a phase difference between the periodic clock received from the periodic clock output section and the data synchronizing clock, a phase variable clock generating section for generating a phase variable clock obtained by varying phase of the periodic clock received from the periodic clock output section so that a variable phase difference which is a phase difference between the phase variable clock and the data synchronizing clock becomes an amount set in advance based on the phase difference and a data sampling section for sampling the sampling data from the transmission signal received from the transmitting section by receiving the transmission signal in synchronism with the phase variable clock to feed it to the data synchronizing clock generating section.

The transmitting section may transmit the transmission signal as serial data, the sampling data may be parallel data having a preset bit number, the data sampling section may have a plurality of bit output sections, each of which is provided in correspondence to each bit of the parallel data, which takes in a value of the serial data at different timing and which outputs the taken-in value as a value of the corresponding bit in the parallel data, the data synchronizing clock generating section has a plurality of bit clock generating sections, each of which is provided in correspondence to the bit and which generates, based on a value of the bit received from the bit output section, the data synchronizing clock synchronized with variation of the value, the periodic phase difference detecting section has a plurality of bit phase difference detecting sections, each of which is provided in correspondence to each bit and which detects the phase difference between the data synchronizing clock generated by the corresponding bit clock generating section and the periodic clock, the phase variable clock generating section has a delay clock generating section for generating a plurality of delay clocks corresponding to the respective bits by delaying the periodic clock by different time and a plurality of delaying sections each of which is provided in correspondence to each of the bits and which generates a signal obtained by delaying phase of the corresponding delay clock based on the phase difference detected by the corresponding bit phase difference detecting section so that the variable phase difference from the corresponding data synchronizing clock becomes the size set in advance as the phase variable clock, wherein each of the bit output sections samples the value of the corresponding bit in the sampling data by taking in the value of the serial data in synchronism with the phase variable clock generated by the corresponding delaying section.

The transmitting section transmits the transmission signal as serial data, the phase variable clock generating section has a delay clock generating section for generating a plurality of delay clocks whose phases are different from each other by delaying the periodic clock by different time, a selecting section for receiving the plurality of delay clocks from the delay clock generating section to select at least a part of the plurality of delay clocks corresponding to an instruction from the outside and a delaying section for generating the phase variable clock corresponding to the delay clock selected by the selecting section by delaying phase of the delay clock selected by the selecting section so that the variable phase difference becomes the size set in advance, wherein the data sampling section generates parallel data having a bit number corresponding a number of the delay clocks selected by the selecting section by receiving the transmission signal in synchronism with each of the phase variable clocks corresponding to the delay clock generated by the delaying section and outputs the parallel data as the sampling data.

The receiving section may further include a clock recovering section for receiving the periodic clock outputted from the periodic clock output section by recovering the periodic clock from the transmission signal received from the transmitting section.

According to a second aspect of the invention, there is provided a signal receiver for receiving a transmission signal, having a data synchronizing clock generating section for generating, based on sampling data sampled from the transmission signal transmitted in synchronism with a periodic clock having a preset period, a data synchronizing clock synchronized with variation of values of the sampling data, a periodic phase difference detecting section for detecting a phase difference between the periodic clock and the data synchronizing clock, a phase variable clock generating section for generating a phase variable clock obtained by varying phase of the periodic clock so that a variable phase difference which is a phase difference between the phase variable clock and the data synchronizing clock becomes an amount set in advance based on the phase difference and a data sampling section for sampling the sampling data from the transmission signal received from the transmitting section by receiving the transmission signal in synchronism with the phase variable clock to feed it to the data synchronizing clock generating section.

According to a third aspect of the invention, there is provided a test apparatus for testing an electronic device, having a test pattern generating section for generating a test pattern for testing the electronic device, a periodic clock output section for outputting a periodic clock having a preset period, a transmitting section for transmitting a transmission signal based on the test pattern received from the test pattern generating section in synchronism with the periodic clock, a receiving section for receiving the transmission signal transmitted from the transmitting section to sample sampling data from the transmission signal, a test pattern feeding section for sampling the test pattern from the sampling data sampled by the receiving section to feed the sampled test pattern to the electronic device, a judging section for judging whether the electronic device is defect-free based on an output signal outputted from the electronic device corresponding to the test pattern, wherein the receiving section has a data synchronizing clock generating section for generating, based on the sampling data sampled from the transmission signal received from the transmitting section, a data synchronizing clock synchronized with variation of values of the sampling data, a periodic, phase difference detecting section for detecting a phase difference between the periodic clock received from the periodic clock output section and the data synchronizing clock, a phase variable clock generating section for generating a phase variable clock obtained by varying phase of the periodic clock received from the periodic clock output section so that a variable phase difference which is a phase difference between the phase variable clock and the data synchronizing clock becomes an amount set in advance based on the phase difference and a data sampling section for sampling the sampling data from the transmission signal received from the transmitting section by receiving the transmission signal in synchronism with the phase variable clock to feed it to the data synchronizing clock generating section.

The test apparatus may include a transmission line for transmitting the transmission signal, a main frame for generating the transmission signal and outputting it to the transmission line and a test head for mounting the electronic device and for feeding the test pattern to the electronic device based on the transmission signal received from the main frame via the transmission line, wherein the main frame may have the test pattern generating section, the periodic clock generating section and the transmitting section, the test head may have the receiving section and the test pattern feeding section and the receiving section may receive the transmission signal from the transmitting section via the transmission line.

The test apparatus may further include a test head having first and second test modules removably fixed, respectively, wherein the first test module may have the test pattern generating section, the periodic clock generating section and the transmitting section, and the second test module may have the receiving section and the test pattern feeding section.

According to a fourth aspect of the invention, there is provided a test head for mounting an electronic device to be tested, having first and second test modules removably and respectively fixed therein, wherein the first test module has a test pattern generating section for generating a test pattern for testing the electronic device, a periodic clock output section for outputting a periodic clock having a preset period and a transmitting section for transmitting a transmission signal based on the test pattern received from the test pattern generating section in synchronism with the periodic clock, the second test module has a receiving section for receiving the transmission signal transmitted from the transmitting section to sample sampling data from the transmission signal and a test pattern feeding section for sampling the test pattern from the sampling data sampled by the receiving section to feed the sampled test pattern to the electronic device, and wherein the receiving section has a data synchronizing clock generating section for generating, based on sampling data sampled from the transmission signal received from the transmitting section, a data synchronizing clock synchronized with variation of values of the sampling data, a periodic phase difference detecting section for detecting a a phase difference between the periodic clock received from the periodic clock output section and the data synchronizing clock, a phase variable clock generating section for generating a phase variable clock obtained by varying phase of the periodic clock received from the periodic clock output section so that a variable phase difference which is a phase difference between the phase variable clock and the data synchronizing clock becomes an amount set in advance based on the phase difference and a data sampling section for sampling the sampling data from the transmission signal received from the transmitting section by receiving the transmission signal in synchronism with the phase variable clock to feed it to the data synchronizing clock generating section.

It is noted that the summary of the invention described above does not necessarily describe all necessary features of the invention. The invention may also be a sub-combination of the features described above.

The invention allows the signal to be transmitted at high precision.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
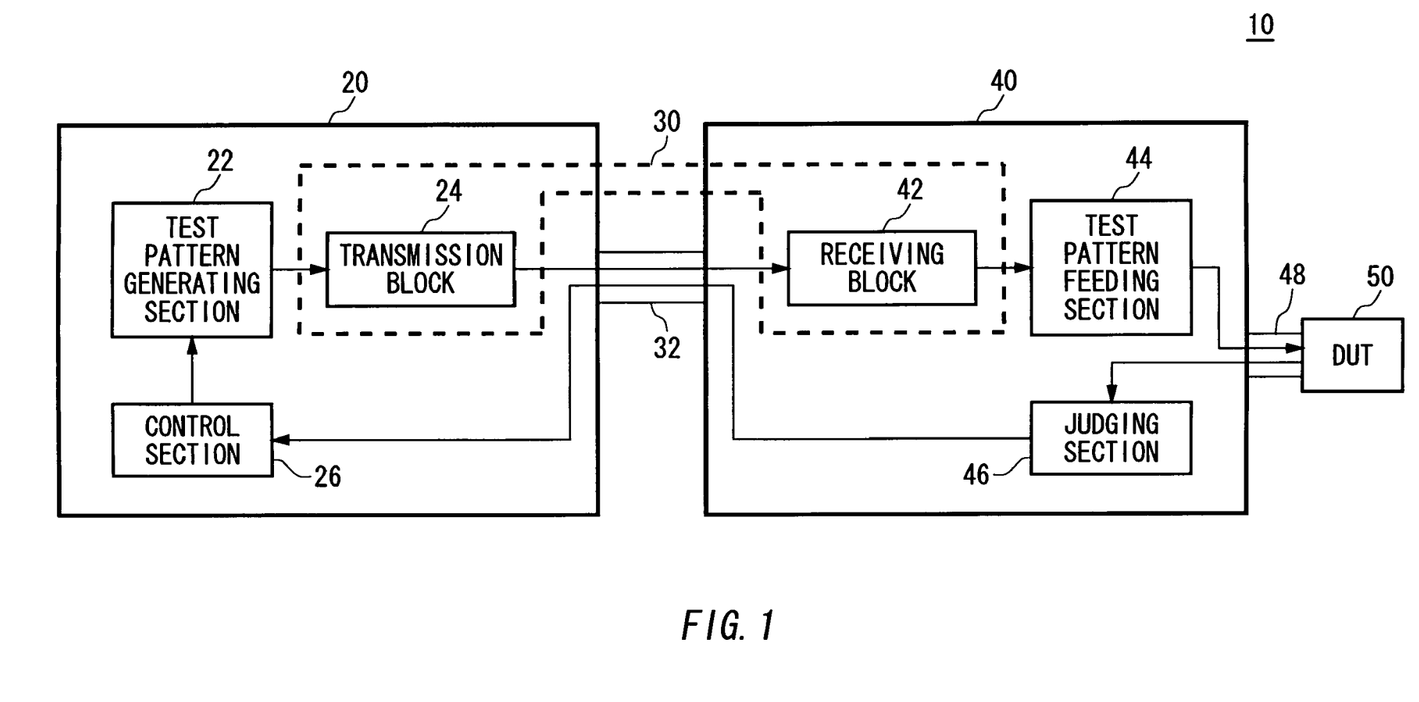
FIG. 1 is a diagram showing one exemplary configuration of a test apparatus 10 according to one embodiment of the invention.

FIG. 1 is a diagram showing one exemplary configuration of a test apparatus 10 according to one embodiment of the invention. The test apparatus 10 is an apparatus for testing an electronic device (DUT) 50 and has a main frame 20, a transmission line 32, an interface 48 and a test head 40. The main frame 20 generates a test pattern for testing the electronic device 50 and transmits the test pattern to the test head 40 via the transmission line 32 such as a cable, for example. The interface 48 is a performance board for example on which the electronic device 50 is mounted and which is connected with the test head 40. The test head 40 mounts the interface 48 for example to mount the electronic device 50.

The test head 40 feeds the test pattern received from the main frame 20 via the transmission line 32 to the electronic device 50 via the interface 48 and judges whether the electronic device 50 is defect-free based on an output signal outputted from the electronic device 50 corresponding to the test pattern. Then, the test head 40 outputs the judgment result of the electronic device 50 to the main frame 20.

The main frame 20 has a control section 26, a test pattern generating section 22 and a transmission block 24. The control section 26 feeds a control signal for controlling the test to the test pattern generating section 22. The control section 26 also receives the judgment result of the electronic device 50 from the test head 40. The control section 26 may display the received judgment result on a display unit provided in the main frame 20, for example.

The test pattern generating section 22 generates the test pattern for testing the electronic device 50 based on the control signal from the control section 26. The transmission block 24 receives the test pattern generated by the test pattern generating section 22, converts it into a transmission signal for transmitting the test pattern and transmits the transmission signal to the test head 40.

The test head 40 has a receiving block 42, a test pattern feeding section 44 and a judging section 46. The receiving block 42 receives the transmission signal from the transmission block 24 and samples sampling data from the received transmission signal. Then, the receiving block 42 feeds the sampled sampling data to the test pattern feeding section 44. It is noted that the test head 40 is one example of a signal receiver. Still more, the transmission block 24 and the receiving block 42 compose a transmission system 30 for transmitting the transmission signal in the present embodiment.

The test pattern feeding section 44 is electrically connected with the electronic device 50 via the interface 48 and samples the test pattern from the received sampling data to feed to the electronic device 50. The judging section 46 receives the output signal outputted from the electronic device 50 and judges whether the electronic device 50 is defect-free by comparing the received output signal with an expected value for example. Then, the judging section 46 outputs the judgment result to the control section 26. It is noted that the judging section 46 may be provided within the main frame 20. Thus, the present embodiment allows the electronic device 50 to be adequately tested.

Figure 2:
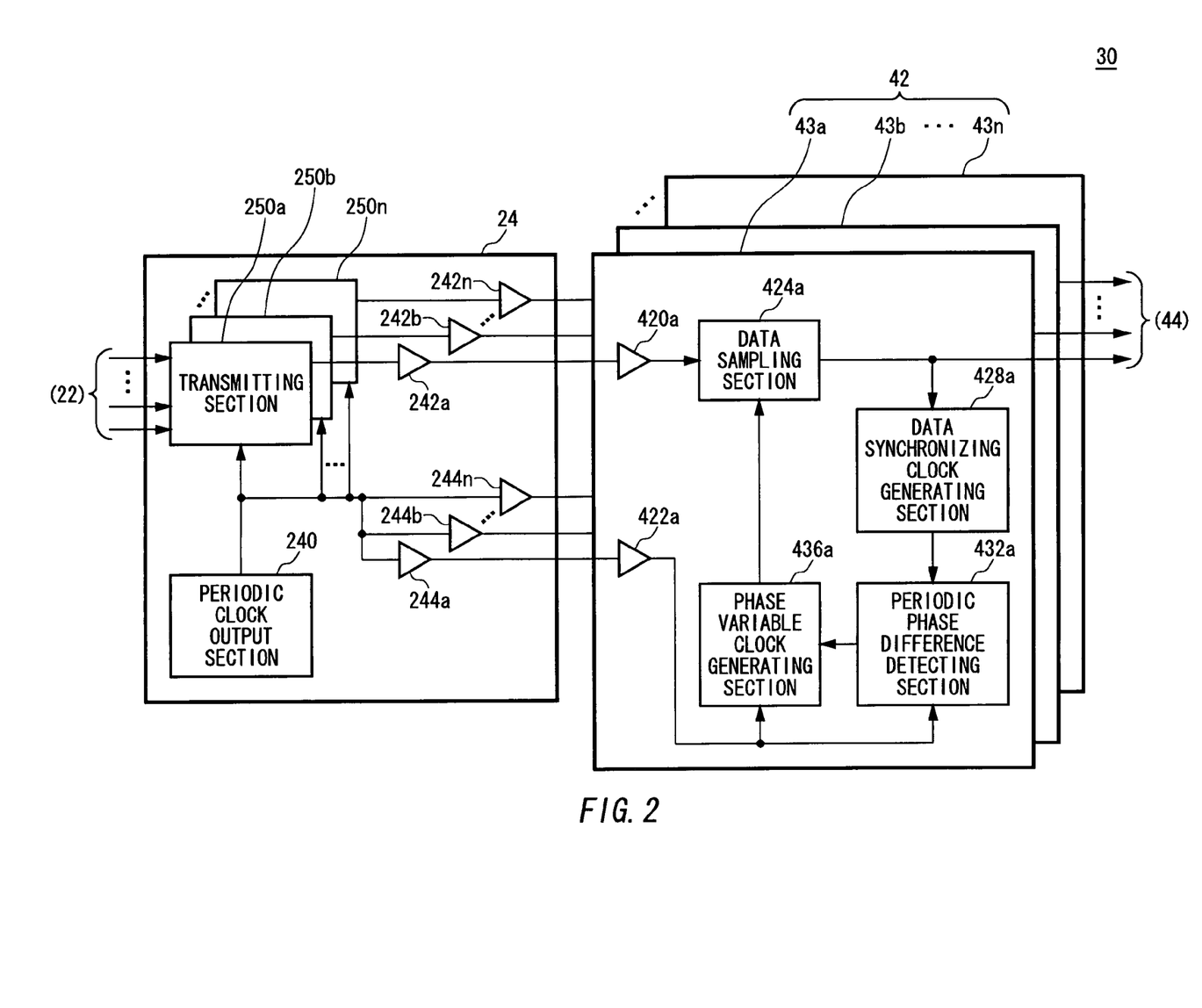
FIG. 2 is a diagram showing one detailed exemplary configuration of a transmission system 30.

FIG. 2 shows one detailed exemplary configuration of the transmission system 30. The transmission block 24 has a periodic clock output section 240, a plurality of transmitting sections 250a through 250n and a plurality of buffers 242a through 242n and 244a through 244n. The periodic clock output section 240 generates a periodic clock having a predetermined period and outputs it to the respective transmitting sections 250 and buffers 244. The periodic clock output section 240 is a low noise signal source such as a crystal oscillator.

Each of the transmitting sections 250 receives a part of the test pattern from the test pattern generating section 22, generates the transmission signal based on the received test pattern and transmits it in synchronism with the periodic clock, respectively. In the present embodiment, each transmission signal is serial data. Each buffers 242 is provided in correspondence to each transmitting section 250 and outputs the transmission signal received from the corresponding transmitting section 250 to the receiving block 42, respectively. Each buffer 244 is provided in correspondence to each transmitting section 250 and outputs the periodic clock received from the periodic clock output section 240 to the receiving block 42.

The receiving block 42 is provided with a plurality of receiving sections 43a through 43n provided respectively in correspondence to the respective transmitting sections 250. Each receiving section 43 has a plurality of buffers 420 and 422, a data sampling section 424, a data synchronizing clock generating section 428, a periodic phase difference detecting section 432 and a phase variable clock generating section 436. The buffer 420 receives the transmission signal from the corresponding buffer 242 to output to the data sampling section 424. The buffer 422 receives the periodic clock from the corresponding buffer 244 to output to the periodic phase difference detecting section 432 and the phase variable clock generating section 436.

The data sampling section 424 samples the sampling data from the transmission signal by receiving the transmission signal in synchronism with a phase variable clock outputted from the phase variable clock generating section 436 and feeds it to the test pattern feeding section 44 and the data synchronizing clock generating section 428. Based on the sampling data received from the data sampling section 424, the data synchronizing clock generating section 428 generates the data synchronizing clock synchronized with variation of value of the sampling data to feed to the periodic phase difference detecting section 432.

The periodic phase difference detecting section 432 detects a phase difference between the periodic clock received from the periodic clock output section 240 via the buffers 244 and 422 and the data synchronizing clock received from the data synchronizing clock generating section 428 and feeds the phase difference to the phase variable clock generating section 436.

Based on the phase difference detected by the periodic phase difference detecting section 432, the phase variable clock generating section 436 outputs a clock obtained by varying the phase of the periodic clock received from the periodic clock output section 240 as the phase variable clock. In the present embodiment, the phase variable clock generating section 436 generates the phase variable clock based on the phase difference so that the variable phase difference which is a phase difference between the phase variable clock and the data synchronizing clock becomes an amount set in advance. The phase variable clock generating section 436 generates such phase variable clock that a leading edge thereof coincides almost with the center of an interval of change points of a value of the transmission signal. The phase variable clock generating section 436 feeds the generated phase variable clock to the data sampling section 424.

It is noted that the test pattern feeding section 44 receives the sampling data outputted respectively from the receiving sections 43 and samples the original test pattern from the sampling data. Although the periodic clock output section 240 is provided within the main frame 20 in the present embodiment, it may be provided within the test head 40 or on the outside of the main frame 20 and the test head 40 as another example.

The transmission system 30 of the present embodiment transmits the transmission signal and the periodic clock through the separate routes. Then, the receiving section 43 monitors fluctuation of the relationship of phases caused by independent drift of the transmission signal and the periodic clock by the data synchronizing clock generating section 428 and the periodic phase difference detecting section 432. Thereby, based on the fluctuation of the relationship of phases, the receiving section 43 controls timing for detecting the value of the received transmission signal. Therefore, according to the present embodiment, the transmission system 30 allows the corresponding receiving section 43 to steadily receive the transmission signal sent from the transmitting section 250.

Figure 3:
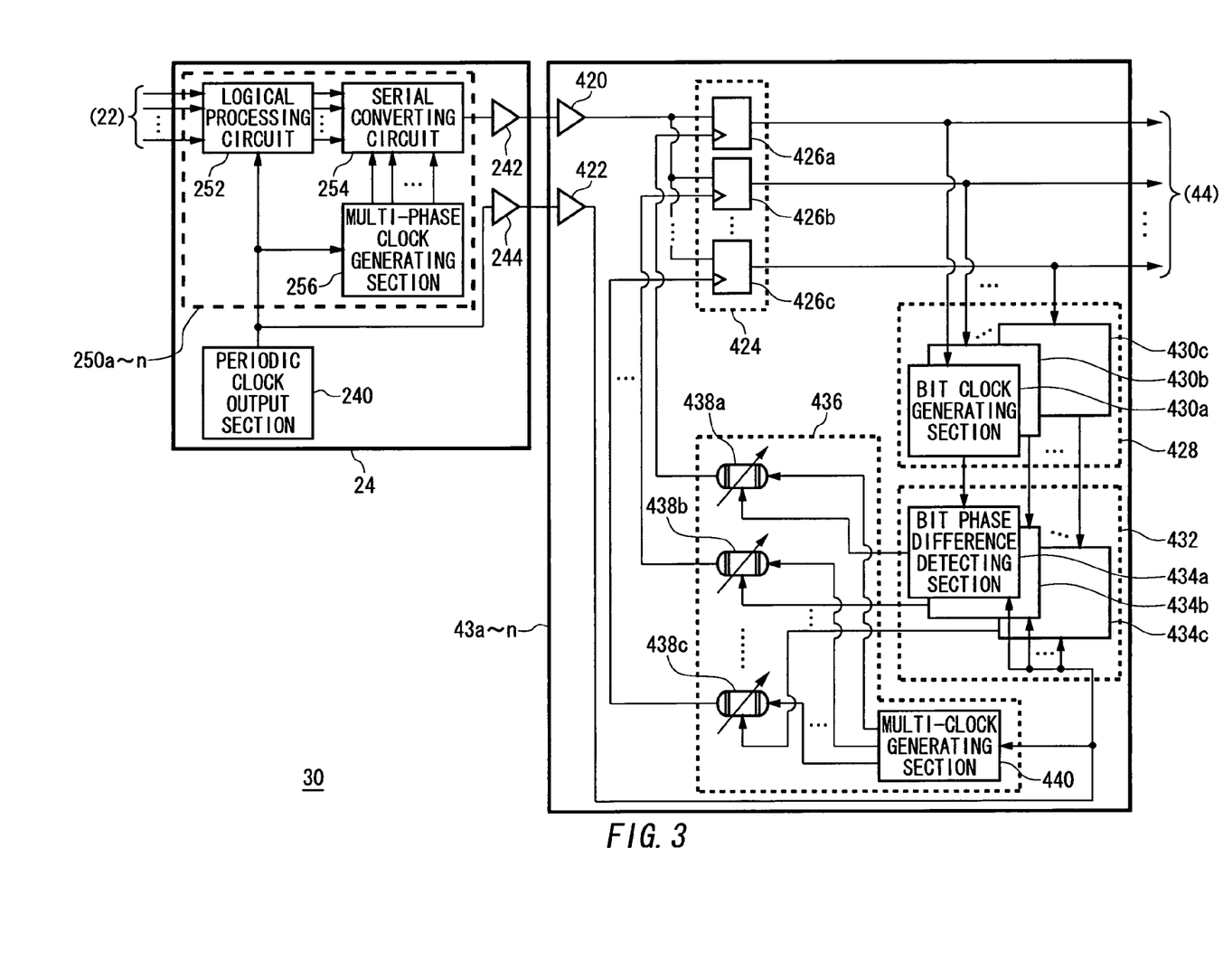
FIG. 3 is a diagram showing a more detailed exemplary configuration of the transmission system 30.

FIG. 3 shows a more detailed exemplary configuration of the transmission system 30. It is noted that because each component in FIG. 3 denoted by the same reference numeral with that in FIG. 2 have the same or similar function or configuration with the component in FIG. 2, their explanation will be omitted here, except of those described below.

Each transmitting sections 250 has a logical processing circuit 252, a multi-phase clock generating section 256 and a serial converting circuit 254. The logical processing circuit 252 receives a part of the test pattern from the test pattern generating section 22 as parallel data, executes such processes as coding, adding of error correcting bits and framing based on the periodic clock received from the periodic clock output section 240 and feeds the processed parallel data to the serial converting circuit 254.

The multi-phase clock generating section 256 receives the periodic clock from the periodic clock output section 240. Then the multi-phase clock generating section 256 generates a plurality of delay clocks whose phases are different from each other by passing the received periodic clock through a plurality of delay elements for example to delay by time different from each other and feeds them to the serial converting circuit 254. Here, each of the delay clocks corresponds to each bit of the parallel data outputted from the logical processing circuit 252. The multi-phase clock generating section 256 is one example of a delay clock generating section in the present embodiment. The multi-phase clock generating section 256 may be a delay locked loop (DLL).

The serial converting circuit 254 receives the parallel data from the logical processing circuit 252 and the plurality of delay clocks from the multi-phase clock generating section 256. Then, the serial converting circuit 254 serially converts the received parallel data based on the delay clock corresponding to each bit of the parallel data and outputs it to the data sampling section 424 via the buffers 242 and 420 as the transmission signal.

In the present embodiment, although each delay clock generated by the multi-phase clock generating section 256 has the same period with the periodic clock, only their phases are different for example. Therefore, each delay clock generates a leading edge by one time each per one period of the periodic clock. The serial converting circuit 254 serially converts each bit of the received parallel data at the leading edge of the corresponding delay clock for example. Thereby, according to the present embodiment, the serial converting circuit 254 converts the parallel data into serial data containing each bit of the parallel data per one period of the periodic clock for example.

The data sampling section 424 has a plurality of bit output sections 426a through 426c corresponding to each bit of the parallel data outputted from the logical processing circuit 252. The data sampling section 424 may have an equal number of bit output sections 426 with a bit number of the parallel data. In the present embodiment, the data sampling section 424 also receives a plurality of phase variable clocks from the phase variable clock generating section 436.

Each bit output section 426 receives each of the plurality of phase variable clocks, respectively. Then, each bit output section 426 takes in the value of the serial data at different timing corresponding to the corresponding phase variable clock. Thereby, each bit output section 426 outputs the value thus taken in to the test pattern feeding section 44 and the data synchronizing clock generating section 428, respectively, as a value of the corresponding bit in the parallel data. In the present embodiment, each bit output section 426 is composed of a flip-flop and others and takes in the value of the serial data at the edge of the corresponding phase variable clock.

It is noted that the test pattern feeding section 44 receives the value of each bit outputted from each bit output section 426 of each receiving section 43. Then, the test pattern feeding section 44 executes processing such as decoding, separation of error correction bit and cancellation of framing and samples the test pattern from the value of each bit to feed to the electronic device 50.

The data synchronizing clock generating section 428 has a plurality of bit clock generating sections 430a through 430c. Each bit clock generating section 430 is provided in correspondence to each bit outputted from each bit output section 426. Based on the value of bit received from the corresponding bit output section 426, each of the plurality of bit clock generating sections 430 generates the data synchronizing clock synchronized with the variation of the value. Thus the bit clock generating section 430 samples phase information of the transmission signal from the change point of the value of the corresponding bit.

The periodic phase difference detecting section 432 has a plurality of bit phase difference detecting sections 434a through 434c. Each of the bit phase difference detecting sections 434 is provided in correspondence to each bit output sections 426. Each bit phase difference detecting section 434 detects is a phase difference between the data synchronizing clock generated by the corresponding bit clock generating section 430 and the periodic clock received from the periodic clock output section 240 via the buffers 244 and 422.

The phase variable clock generating section 436 has a multi-phase clock generating section 440 and a plurality of delaying sections 438a through 438c. The multi-phase clock generating section 440 receives the. periodic clock via the corresponding buffers 244 and 422. Then, the multi-phase clock generating section 440 generates the plurality of delay clocks having different phases by passing the received periodic clock through the plurality of delay elements for example to delay by time different from each other. In this case, each delay clock corresponds to each bit outputted from the bit output section 426, respectively.

The plurality of delaying sections 438a through 438c are provided in correspondence to the respective bits outputted from the respective bit output sections 426. Each delaying section 438 generates the phase variable clock by delaying the phase of the corresponding delay clock based on the phase difference detected by the corresponding bit phase difference detecting section 434 so that the variable phase difference from the corresponding data synchronizing clock becomes an amount set in advance and feeds it to the corresponding bit output section 426.

Here, by receiving the corresponding phase variable clock, each bit output section 426 takes in the corresponding bit from the serial data per period corresponding to one period of the periodic clock. In this case, each delaying section 438 generates the phase variable clock by varying the delay of the corresponding delay clock so that the leading edge of the corresponding phase variable clock coincides almost with the center of a corresponding bit interval within the serial data for example.

Thus each receiving section 43 compares the phase of each bit of the received parallel data with the phase of the received periodic clock and always feeds back and controls the corresponding phase variable clock so that each bit output section 426 takes in the bit with predetermined timing.

Here, if a signal is to be transmitted in synchronism with a clock outputted from the PLL for example, the output clock of the PLL contains random jitter caused by phase noise because the VCO of the PLL has the phase noise. Therefore, there has been a case when a transmission signal to be transmitted contains the random jitter, thus increasing BER (Bit Error Rate) in receiving the transmission signal. Still more, although the phase noise of the VCO may be reduced by designing an oscillating circuit so that its value Q is high, a lock range of the PLL becomes low in this case. Still more, effects of dispersion such as constants of parts composing the VCO, wiring resistance, de-coupling capacity between substrates increase more by increasing the value Q. Therefore, it has been necessary to select the center of the dispersion to oscillate the PLL at desirable frequency, thus increasing the cost.

The transmission system 30 of the present embodiment transmits signals by using the plurality of delay clocks generated by the multi-phase clock generating section 256 as the reference clock in transmitting and receiving the signals. The multi-phase clock generating section 256 generates the plurality of delay clocks by passing the periodic clock outputted from the periodic clock output section 240 through the plurality of delay elements within the multi-phase clock generating section 256 for example. Thus, the transmission block 24 requires no oscillating circuit such as a PLL, so that the transmission signal transmitted by the transmission system 30 contains no random jitter caused by the phase noise of the VCO. Still more, the receiving section 43 also requires no oscillating circuit such as a PLL, so that the phase variable clock received by each bit output sections 426 contains no random jitter caused by the phase noise of the VCO. Accordingly, the present embodiment allows the signals to be transmitted with less BER.

Still more, when transmission speed is to be changed in transmitting a signal by using the VCO, it becomes necessary to change oscillation frequency of the VCO and to change the circuit structure of the VCO. However, the transmission system 30 of the present embodiment allows the transmission speed to be changed by adjusting the delay of the multi-phase clock generating section 256 and the multi-phase clock generating section 440 for example without changing the circuit structure.

Figure 4:
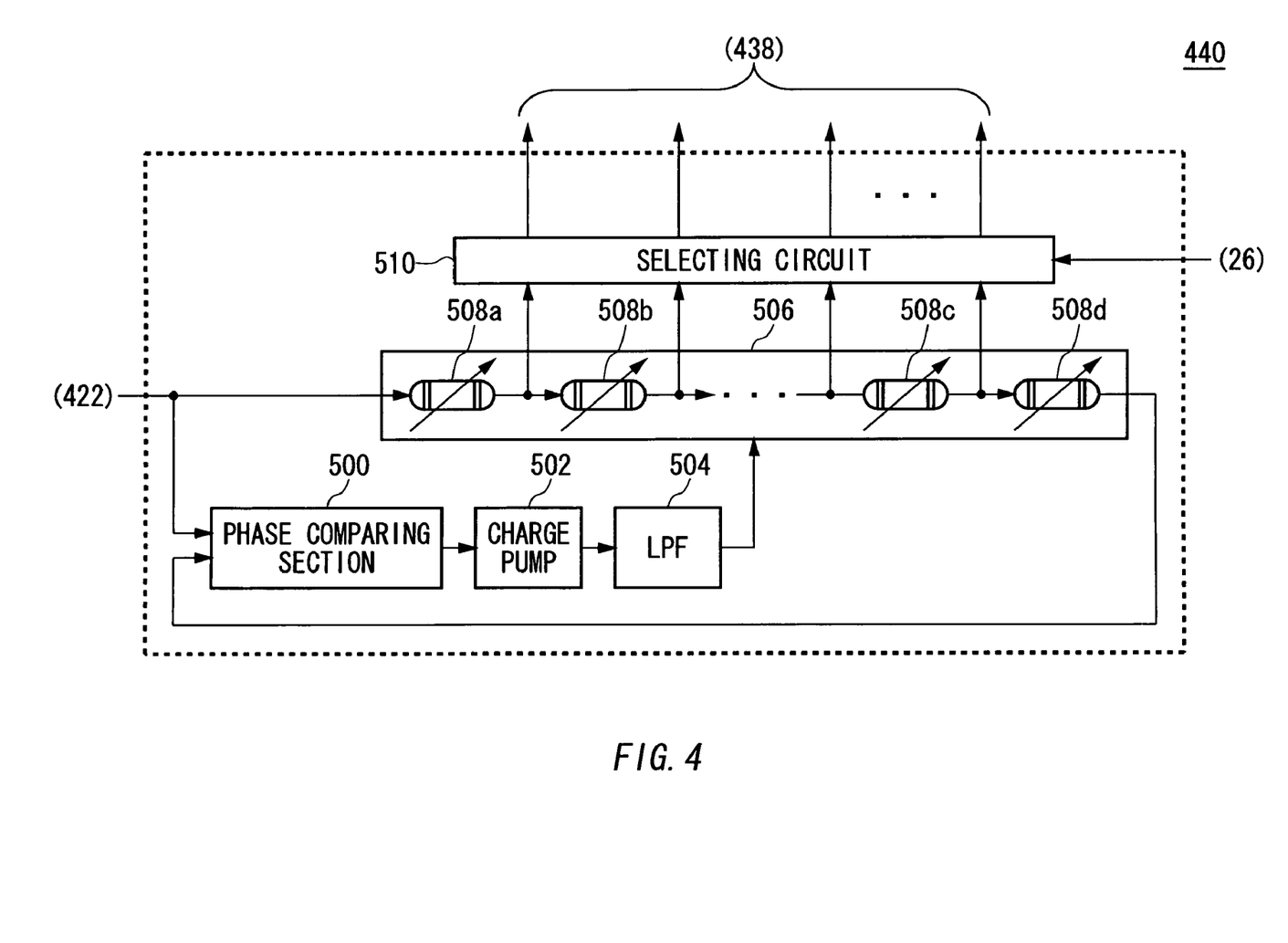
FIG. 4 is a diagram showing one detailed exemplary configuration of a multi-phase clock generating section 440.

FIG. 4 shows one detailed exemplary configuration of the multi-phase clock generating section 440. The multi-phase clock generating sect-ion 440 has a phase comparing section 500, a charge pump 502, a low pass filter (LPF) 504, a delay circuit section 506 and a selecting circuit 510. Based on voltage received from the low pass filter 504, the delay circuit section 506 generates the plurality of delay clocks whose phases are different from each other by delaying the periodic clock received from the periodic clock output section 240 (see FIG. 3) via the buffers 422 and 244 by different time and outputs them to the selecting circuit 510. The delay circuit section 506 also generates an output clock based on the periodic clock and outputs it to the phase comparing section 500.

The phase comparing section 500 compares phase of the output clock received from the delay circuit section 506 with that of the periodic clock and feeds the comparison result to the charge pump 502. The charge pump 502 generates voltage based on the received comparison result to and feeds it to the low pass filter 504. The low pass filter 504 removes high frequency from the received voltage and feeds it to the delay circuit section 506.

The delay circuit section 506 has a plurality of delaying sections 508a through 508d connected in series. The first delaying section 508a receives the periodic clock and delays the received periodic clock based on the output voltage of the low pass filter 504. Thereby, the delaying section 508a generates delayed clocks and outputs it to the selecting circuit 510 and the succeeding delaying section 508b. Each of the delaying sections 508b through 508c generates a minus delay clock by delaying further the delay clock received from the previous delaying section 508 based on the output voltage of the low pass filter 504 and outputs it to the selecting circuit 510 and the succeeding delaying section 508, respectively. The last delaying section 508d generates the output clock by delaying further the delay clock received from the previous delaying section 508c based on the output voltage of the low pass filter 504 and outputs it to the phase comparing section 500.

The phase comparing section 500 causes the delay circuit section 506 to generate the plurality of delay clocks by controlling the charge pump 502 so that the phase difference between the output clock received from the delaying section 508d and the periodic clock becomes a predetermined value and to output to the selecting circuit 510. The phase comparing section 500 controls the charge pump 502 so that the phase of the output clock of the delay circuit section 506 is equalized with the phase of the periodic clock for example.

Receiving the plurality of delay clocks from the delay circuit section 506, the selecting circuit 510 selects at least a part of the plurality of delay clocks corresponding to a select signal which is an instruction from the outside and outputs it to the outside. It thus allows a number of delay clocks outputted from the selecting circuit 510 to be varied corresponding to the select signal. It is noted that the selecting circuit 510 receives the select signal from the control section 26 for example. The multi-phase clock generating section 256 (see FIG. 3) also has the same or similar function and structure with the multi-phase clock generating section 440 in the present embodiment.

In the present embodiment, the delay circuit section 506 is provided with the delaying sections 508a through 508c by a same number with a maximum bit number of the parallel data that can be outputted from the data sampling section 424 (see FIG. 3). Each bit output section 426 (see FIG. 3) outputs a corresponding bit by receiving the delay clock outputted from the selecting circuit 510. Further, when the selecting circuit 510 outputs the respective delay clocks, the corresponding phase variable clock generating section 436 (see. FIG. 3) feeds the phase variable clock to the corresponding bit output section 426.

Each of the bit output sections 426 receives the transmission signal in synchronism with each of the phase variable clocks corresponding to the delay clock generated by each delaying section 438. Thereby, each bit output section 426 generates the parallel data having a bit number corresponding to the number of the delay clocks selected by the selecting circuit 510 and outputs the parallel data as sampling data.

Accordingly, the selecting circuit 510 can vary the bit number to be converted into the parallel data at once corresponding to the select signal inputted to the selecting circuit 510. Thus, the present embodiment allows the bit number of the transmission signal received per unit time to be changed.

Thus, the transmission speed may be varied without changing the circuit structure by controlling the select signal inputted to the selecting circuit 510 corresponding to the transmission speed of the transmission signal. It is noted that the multi-phase clock generating section 256 and the multi-phase clock generating section 440 may output delay clocks of a number equal to the plurality of the delaying sections 508a through 508c without using the selecting circuit 510.

Figure 5:
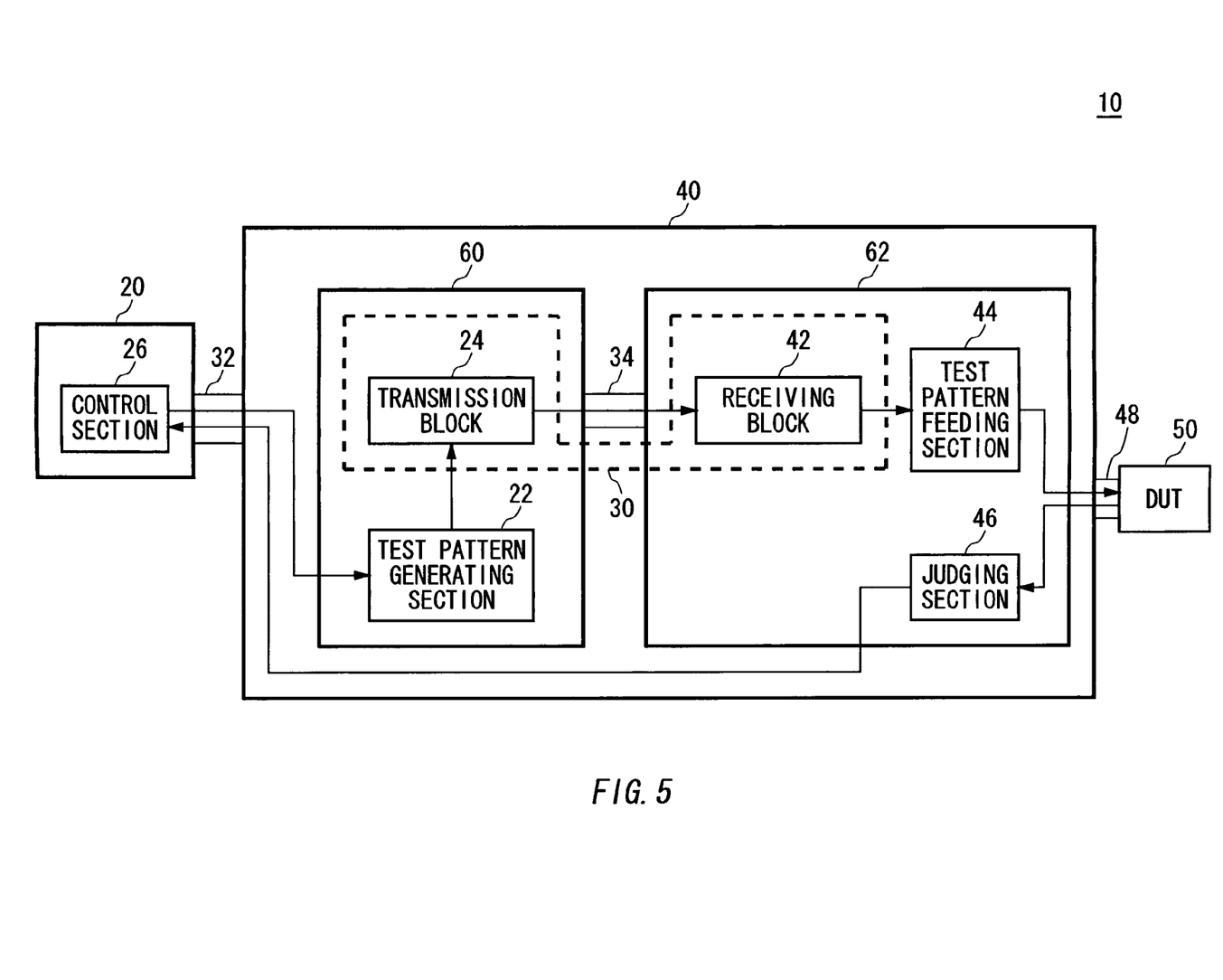
FIG. 5 is a diagram showing another exemplary configuration of the test apparatus 10.

FIG. 5 shows another exemplary configuration of the test apparatus 10. It is noted that components in FIG. 5 denoted by the same reference numerals with those in FIG. 1 have the same or similar functions and structures with the components in FIG. 1, so that their explanation will be omitted here, except of those explained below. The test apparatus 10 has the main frame 20, the transmission line 32 and the test head 40. The main frame 20 has the control section 26 to feed the control signal for controlling the test to the test head 40 via the transmission line 32.

The test head 40 has the interface 48, a first test module 60, a transmission line 34 and a second test module 62. The first test module 60 and the second test module 62 are removably fixed within the test head 40, respectively. The first test module 60 has the test pattern generating section 22 and the transmission block 24. The test pattern generating section 22 generates the test pattern based on the control signal fed from the main frame 20 and feeds it to the transmission block 24. The transmission block 24 converts the test pattern fed as described above into a transmission signal and transmits it to the second test module 62 via the transmission line 34. It is noted that in this example, the transmission line 34 may include a cable, a connector and the like for connecting the first test module 60 with the second test module 62.

The second test module 62 has the receiving block 42, the test pattern feeding section 44 and the judging section 46. The receiving block 42 samples the sampling data from the transmission signal received from the first test module 60 and feeds it to the test pattern feeding section 44. The test pattern feeding section 44 samples the test pattern from the fed sampling data and feeds it to the electronic device 50 via the interface 48. The judging section 46 receives a signal outputted from the electronic device 50 corresponding to the test pattern and compares it with an expected value. Then, the judging section 46 judges whether the electronic device 50 is defect-free and outputs the judgment result to the main frame 20 via the transmission line 32. It is noted that the judging section 46 may be provided within the main frame 20.

In the present embodiment, the transmission block 24 and the receiving block 42 compose the transmission system 30 for transmitting the transmission signal. The present embodiment allows the transmission signal outputted from the first test module 60 to be transmitted to the second test module 62 via the transmission line 34 with less BER.

Figure 6:
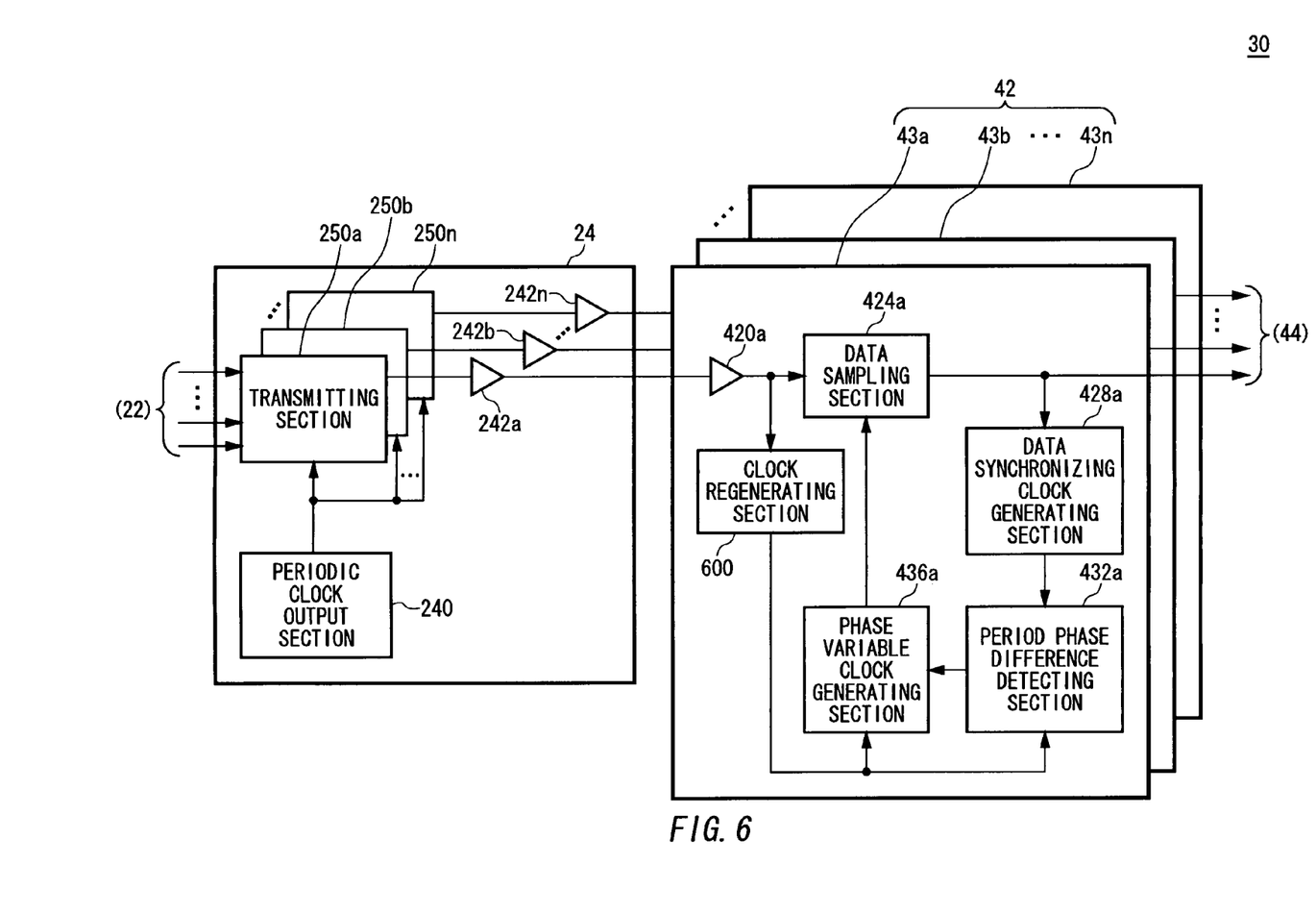
FIG. 6 is a diagram showing another detailed exemplary configuration of the transmission system 30.

FIG. 6 shows another exemplary detailed configuration of the transmission system 30. Each component in FIG. 6 denoted by the same reference numeral with that in FIG. 2 have the same or similar function and structure, so that their explanation will be omitted here, except of the following differences. The receiving section 43 of this example receives the periodic clock by recovering the transmission signal, instead of receiving the periodic clock outputted from the periodic clock output section 240 via the buffers 244 and 422.

Each receiving section 43 of this example further includes a clock recovering section 600. The clock recovering section 600 recovers the periodic clock from the transmission signal received from the corresponding buffer 420. The clock recovering section 600 can receive the periodic clock outputted from the periodic clock output section 240 via the transmitting section 250 and the buffers 242 and 420. Then, the clock recovering section 600 outputs the recovered periodic clock to the periodic phase difference detecting section 432 and the phase variable clock generating section 436. Receiving the recovered periodic clock, the periodic phase difference detecting section 432 detects a phase difference between the recovered periodic clock and the data synchronizing clock as a periodic phase difference. Still more, based on the phase difference detected by the periodic phase difference detecting section 432, the phase variable clock generating section 436 outputs a clock obtained by varying the phase of the recovered periodic clock as the phase variable clock.

Thus, the transmission system 30 of the present embodiment allows the transmission signal to be transmitted at high precision without feeding the periodic clock in parallel with the transmission signal from the transmission block 24 to the receiving block 42.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

For example, the periodic clock output section 240 may feed periodic clocks oscillated from different clock oscillators to the transmitting section 250 and the receiving section 43. That is, the periodic clock output section 240 may have a transmission side periodic clock output section provided as a part of the transmission block 24 and a receiving side periodic clock output section provided as a part of the receiving block 42. In this case, the transmission side periodic clock output section generates a periodic clock of the transmission side based on the clock oscillated by the first clock oscillator and outputs it to the transmitting section 250. The receiving side periodic clock output section also generates a periodic clock of the receiving side having substantially the same frequency with the transmission side periodic clock based on a clock oscillated from the second clock oscillator and outputs it to the periodic phase difference detecting section 432 and the phase variable clock generating section 436 within the receiving section 43. Industrial Applicability As it is apparent from the above description, the signal to be transmitted may be transmitted at high precision.

What is claimed is:

1. A transmission system for transmitting a transmission signal comprising:
   a periodic clock output section for outputting a periodic clock having a preset period;
   a transmitting section for transmitting as serial data said transmission signal in synchronism with said periodic clock; and
   a receiving section for receiving said transmission signal transmitted from said transmitting section,
   wherein said receiving section comprises:
      a data synchronizing clock generating section for generating, based on sampling data sampled from said transmission signal received from said transmitting section, a data synchronizing clock synchronized with variation of values of said sampling data;

a periodic phase difference detecting section for detecting a phase difference between said periodic clock received from said periodic clock output section and said data synchronizing clock;

a phase variable clock generating section for generating a plurality of phase variable clocks obtained by varying phase of said periodic clock received from said periodic clock output section so that a variable phase difference which is a phase difference between each of said plurality of phase variable clocks and said data synchronizing clock becomes an amount set in advance based on said phase difference, the phase variable clock generating section comprising:

a delay clock generating section for generating a plurality of delay clocks corresponding to bits of sampling data, whose phases are different from each other, by delaying the periodic clock by different times; and a delaying section for generating said plurality of phase variable clocks corresponding to said plurality of delay clocks by delaying the phase of each of said plurality of delay clocks so that said variable phase difference becomes said amount set in advance; and a data sampling section for sampling said sampling data from said transmission signal received from said transmitting section by receiving said transmission signal in synchronism with said phase variable clock to feed it to said data synchronizing clock generating section, wherein the data sampling section generates parallel data by receiving said transmission signal in synchronism with each of said plurality of phase variable clocks corresponding to said plurality of delay clocks generated by said delaying section and outputs said parallel data as said sampling data.

2. The transmission system as set forth in claim 1, wherein said sampling data is parallel data having a preset bit number, said data sampling section has a plurality of bit output sections, each of which is provided in correspondence to each bit of said parallel data, which takes in a value of said serial data at different timing and which outputs said taken-in value as a value of said corresponding bit in said parallel data, said data synchronizing clock generating section has a plurality of bit clock generating sections, each of which is provided in correspondence to said bit and which generates, based on a value of said bit received from said bit output section, said data synchronizing clock synchronized with variation of said value, and said periodic phase difference detecting section has a plurality of bit phase difference detecting sections, each of which is provided in correspondence to each of said bits and which detects said phase difference between said data synchronizing clock generated by said corresponding bit clock generating section and said periodic clock, the transmission system further comprising:

a plurality of delaying sections, each of which is provided in correspondence to each of said bits and which generates a signal obtained by delaying phase of said corresponding delay clock based on said phase difference detected by said corresponding bit phase difference detecting section so that said variable phase difference from said corresponding data synchronizing clock becomes said amount set in advance as said phase variable clock, wherein each of said bit output sections samples the value of said corresponding bit in said sampling data by taking in the value of said serial data in synchronism with said phase variable clock generated by said corresponding delaying section.

3. The transmission system as set forth in claim 1, wherein said delay clock generating section generates a plurality of delay clocks whose phases are different from each others, said phase variable clock generating section comprises a selecting section for receiving said plurality of delay clocks from said delay clock generating section to select at least a part of said plurality of delay clocks corresponding to an instruction from the outside, said delaying section generates said phase variable clock corresponding to said delay clock selected by said selecting section by delaying the phase of said delay clock selected by said selecting section so that said variable phase difference becomes said amount set in advance, and said data sampling section generates parallel data having a bit number corresponding to a number of said delay clocks selected by said selecting section.

4. The transmission system as set forth in claim 1, further comprising a clock recovering section for receiving said periodic clock outputted from said periodic clock output section by recovering said periodic clock from said transmission signal received from said transmitting section.

5. A signal receiver for receiving a transmission signal comprising:

a data synchronizing clock generating section for generating, based on sampling data sampled from said transmission signal transmitted as serial data in synchronism with a periodic clock having a preset period, a data synchronizing clock synchronized with variation of values of said sampling data;

a periodic phase difference detecting section for detecting a phase difference between said periodic clock and said data synchronizing clock;

a phase variable clock generating section for generating a plurality of phase variable clocks obtained by varying phase of said periodic clock so that a variable phase difference which is a phase difference between each of said plurality of phase variable clocks and said data synchronizing clock becomes an amount set in advance based on said phase difference, the phase variable clock generating section comprising:

a delay clock generating section for generating a plurality of delay clocks corresponding to bits of sampling data, whose phases are different from each other, by delaying the periodic clock by different times; and a delaying section for generating said plurality of phase variable clocks corresponding to said plurality of delay clocks by delaying the phase of each of said plurality of delay clocks so that said variable phase difference becomes said amount set in advance; and a data sampling section for sampling said sampling data from said transmission signal received from said transmitting section by receiving said transmission signal in synchronism with said phase variable clock to feed it to said data synchronizing clock generating section, wherein the data sampling section generates parallel data by receiving said transmission signal in synchronism with each of said plurality of phase variable clocks corresponding to said plurality of delay clocks generated by said delaying section and outputs said parallel data as said sampling data.

6. A test apparatus for testing an electronic device comprising:
- a test pattern generating section for generating a test pattern for testing said electronic device;
- a periodic clock output section for outputting a periodic clock having a preset period;
- a transmitting section for transmitting a transmission signal based on said test pattern received from said test pattern generating section in synchronism with said periodic clock;
- a receiving section for receiving said transmission signal transmitted from said transmitting section to sample sampling data from said transmission signal;
- a test pattern feeding section for sampling said test pattern from said sampling data sampled by said receiving section to feed said sampled test pattern to said electronic device; and
- a judging section for judging whether said electronic device is defect-free based on an output signal outputted from said electronic device corresponding to said test pattern,
- wherein said receiving section comprises:
  - a data synchronizing clock generating section for generating, based on sampling data sampled from said transmission signal received from said transmitting section, a data synchronizing clock synchronized with variation of values of said sampling data;
  - a periodic phase difference detecting section for detecting a phase difference between said periodic clock received from said periodic clock output section and said data synchronizing clock;
  - a phase variable clock generating section for generating a phase variable clock obtained by varying phase of said periodic clock received from said periodic clock output section so that a variable phase difference which is a phase difference between said phase variable clock and said data synchronizing clock becomes an amount set in advance based on said phase difference; and
  - a data sampling section for sampling said sampling data from said transmission signal received from said transmitting section by receiving said transmission signal in synchronism with said phase variable clock to feed it to said data synchronizing clock generating section,
- wherein said test apparatus further comprises:
  - a transmission line for transmitting said transmission signal;
  - a main frame for generating said transmission signal and outputting it to said transmission line; and
  - a test head for mounting said electronic device and for feeding said test pattern to said electronic device based on said transmission signal received from said main frame via said transmission line, wherein
    - said main frame has said test pattern generating section, said periodic clock generating section and said transmitting section,
    - said test head has said receiving section and said test pattern feeding section, and
    - said receiving section receives said transmission signal from said transmitting section via said transmission line.

7. The test apparatus as set forth in 6, comprising a test head having first and second test modules removably fixed, respectively, wherein
- said first test module has said test pattern generating section, said periodic clock generating section and said transmitting section, and
- said second test module has said receiving section and said test pattern feeding section.

8. A test head for mounting an electronic device to be tested, having first and second test modules removably and respectively fixed therein, wherein
- said first test module comprises:
  - a test pattern generating section for generating a test pattern for testing said electronic device;
  - a periodic clock output section for outputting a periodic clock having a preset period; and
  - a transmitting section for transmitting as serial data a transmission signal based on said test pattern received from said test pattern generating section in synchronism with said periodic clock, and
- said second test module comprises:
  - a receiving section for receiving said transmission signal transmitted from said transmitting section to sample sampling data from said transmission signal; and
  - a test pattern feeding section for sampling said test pattern from said sampling data sampled by said receiving section to feed said sampled test pattern to said electronic device,
  - wherein said receiving section comprises:
    - a data synchronizing clock generating section for generating, based on the sampling data sampled from said transmission signal received from said transmitting section, a data synchronizing clock synchronized with variation of values of said sampling data;
    - a periodic phase difference detecting section for detecting a phase difference between said periodic clock received from said periodic clock output section and said data synchronizing clock;
    - a phase variable clock generating section for generating a plurality of phase variable clocks obtained by varying phase of said periodic clock received from said periodic clock output section so that a variable phase difference which is a phase difference between each of said plurality of phase variable clocks and said data synchronizing clock becomes an amount set in advance based on said phase differences, the phase variable clock generating section comprising:
      - a delay clock generating section for generating a plurality of delay clocks corresponding to bits of sampling data, whose phases are different from each other, by delaying the periodic clock by different times; and
      - a delaying section for generating said plurality of phase variable clocks corresponding to said plurality of delay clocks by delaying the phase of each of said plurality of delay clocks so that said variable phase difference becomes said amount set in advance; and
    - a data sampling section for sampling said sampling data from said transmission signal received from said transmitting section by receiving said transmission signal in synchronism with said phase variable clock to feed it to said data synchronizing clock generating section, wherein the data sampling section generates parallel data by receiving said transmission signal in synchronism with each of said plurality of phase variable clocks corresponding to said plurality of delay clocks generated by said delaying section and outputs said parallel data as said sampling data.

9. The test apparatus as set forth in claim 6, wherein
said transmitting section transmits said transmission signal as serial data,
said phase variable clock generating section comprises:
   a delay clock generating section for generating a plurality of delay clocks whose phases are different from each other by delaying the periodic clock by different times; and
   a delaying section for generating a plurality of said phase variable clocks corresponding to said plurality of delay clocks by delaying the phase of each of said plurality of delay clocks so that said variable phase difference becomes said amount set in advance,
wherein the data sampling section generates parallel data by receiving said transmission signal in synchronism with each of said plurality of phase variable clocks corresponding to said plurality of delay clocks generated by said delaying section and outputs said parallel data as said sampling data.

* * * * *